US007977961B2

(12) United States Patent
Koizumi et al.

(10) Patent No.: US 7,977,961 B2
(45) Date of Patent: Jul. 12, 2011

(54) COMPONENT FOR TESTING DEVICE FOR ELECTRONIC COMPONENT AND TESTING METHOD OF THE ELECTRONIC COMPONENT

(75) Inventors: Daisuke Koizumi, Kawasaki (JP); Naohito Kohashi, Kawasaki (JP); Yuji Akasaki, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 126 days.

(21) Appl. No.: 12/358,522

(22) Filed: Jan. 23, 2009

(65) Prior Publication Data

US 2009/0302876 A1     Dec. 10, 2009

(30) Foreign Application Priority Data

Jun. 9, 2008   (JP) ................................. 2008-150895

(51) Int. Cl.
   *G01R 31/00*   (2006.01)
(52) U.S. Cl. .............................. 324/756.07; 324/756.01
(58) Field of Classification Search .................. None
   See application file for complete search history.

(56) References Cited

U.S. PATENT DOCUMENTS

| | | | | |
|---|---|---|---|---|
| 4,766,371 A | * | 8/1988 | Moriya ......................... | 324/763 |
| 5,180,974 A | * | 1/1993 | Mitchell et al. ............... | 324/755 |
| 5,528,466 A | * | 6/1996 | Lim et al. ..................... | 361/820 |
| 5,990,692 A | | 11/1999 | Jeong et al. | |
| 6,203,332 B1 | * | 3/2001 | Tashiro et al. ................ | 439/71 |

FOREIGN PATENT DOCUMENTS

| | | |
|---|---|---|
| JP | 10-090350 A | 4/1998 |
| JP | 2920859 B2 | 7/1999 |
| JP | 2004-085424 A | 3/2004 |

OTHER PUBLICATIONS

Korean Notice of Preliminary Rejection, English-language translation, mailed Nov. 29, 2010 for corresponding Korean Application No. 10-2009-0010096.

* cited by examiner

*Primary Examiner* — Minh N Tang
(74) *Attorney, Agent, or Firm* — Fujitsu Patent Center

(57) ABSTRACT

A component for a testing device for an electronic component includes a testing board; a projection electrode provided on a main surface of the testing board; a positioning part provided on the main surface of the testing board, the positioning part being configured to position the electronic component; and a pressing part configured to press the electronic component being positioned by the positioning part and make a lead part of the electronic component come in contact with the projection electrode so that the lead part is elastically deformed and made come in contact with the projection electrode.

7 Claims, 16 Drawing Sheets

COMPONENT FOR TESTING DEVICE FOR ELECTRONIC COMPONENT AND TESTING METHOD OF THE ELECTRONIC COMPONENT

CROSS-REFERENCE TO RELATED APPLICATIONS

This patent application is based upon and claims the benefit of priority of Japanese Patent Application No. 2008-150895 filed on Jun. 9, 2008, the entire contents of which are hereby incorporated herein by reference.

FIELD

The embodiments discussed herein are related to components for testing devices for electronic components and a testing method of the electronic components.

BACKGROUND

Recently, as miniaturization, thin size, and high functions are demanded for electronic apparatuses such as mobile communication apparatuses, miniaturization, thin size, and high functions are required for semiconductor devices provided inside the electronic apparatuses. Because of this, for example, a CSP (Chip Size Package) type semiconductor device which is a package having dimensions equal to or slightly larger than those of the semiconductor element has been suggested.

However, a semiconductor device for an automobile may be operated under tough atmospheric conditions. Therefore, a surface mounted type semiconductor device using a lead pin such as a SOP (Small Outline Package) type semiconductor device or a QFP (Quad Flat Package) type semiconductor device has been used a lot.

As various electronic controls for automobiles have been recently developed, hybrid technologies have progressed, and automobile components are commonly used; therefore high throughput is required for manufacturing and testing steps of the related semiconductor devices. Especially, in order to eliminate primary defects, approximately eight through approximately forty eight hours are required for a burn-in process where an accelerated test is performed so that temperature and voltage stress are applied to the semiconductor device.

A related art burn-in board 1 used in the burn-in process is illustrated in FIG. 1.

An edge terminal part 2 is provided at one end part of the burn-in board 1 illustrated in FIG. 1. The edge terminal part 2 is connected to a burn-in apparatus not illustrated in FIG. 1. In addition, a large number of sockets 3 are mounted on a part of a main surface of the burn-in board 1 other than the edge terminal part 2. A semiconductor package 4 (see FIG. 2) is mounted on the socket 3.

The socket 3 illustrated in FIG. 1 and the semiconductor package 4 mounted on the socket 3 are illustrated in FIG. 2. In addition, the socket 3 mounted on the burn-in board 1 is illustrated in FIG. 3. The semiconductor package 4 is mounted on the socket 3 and a cover 5 is provided above the socket 3.

A semiconductor package mounting part 3a is provided in a substantially center of the socket 3. Plural contacts 3b having spring properties are provided outside the semiconductor package mounting part 3a. End parts of the contacts 3b are inserted in through holes 6 formed in the burn-in board 1 and fixed to the burn-in board 1 by solder. When contact parts 5a extending inside the cover 5 come in contact with the contacts 3b, the other end parts of the contacts 3b come in contact with leads 4a of the semiconductor package 4 mounted on the semiconductor package mounting part 3a.

The leads 4a of the semiconductor package 4 are provided on two side surfaces facing each other of a resin part 4b. The resin part 4b seals the semiconductor element. The leads 4a are made of, for example, a copper (Cu) alloy or an iron-nickel (Fe—Ni) alloy.

The end parts of the contacts 3b of the socket 3 are positioned corresponding to the leads 4a of the semiconductor package 4. When the semiconductor package 4 is mounted on the socket 3 as indicated by an arrow in FIG. 2, the semiconductor package 4 is positioned by the socket 3 so that electrical contact between the contacts 3b and the semiconductor package 4 is obtained. The semiconductor package 4 has the same configuration as a semiconductor package just separated from a lead frame (not illustrated).

In addition, the following structure has been suggested. That is, an IC lead is sandwiched by a lid part and a burn-in board. The lid part has a pressing part configured to press the IC lead. The burn-in board has a contact stick configured to support the lead. See Japanese Patent No. 2920859.

However, in order to mount or remove the semiconductor packages 4 on or from a large number of the sockets 3 mounted on the burn-in board illustrated in FIG. 1, it is necessary to attach or detach one semiconductor package 4 for every socket 3. For example, in a case where a hundred (100) sockets 3 are mounted on a single burn-in board 1, it is necessary to attach or detach semiconductor packages 4 a hundred (100) times.

Because of this, even if the semiconductor packages 4 are attached to or detached from the sockets 3 by using an automatic machine, it is necessary to perform the above-mentioned operation for every socket 3 and therefore it takes a lot of time.

In addition, if the number of the sockets 3 to be mounted on the burn-in board 1 is increased, the number of the semiconductor packages 4 to be used one time in the burn-in apparatus (not illustrated) is increased so that the operational efficiency is increased. However, it is difficult to increase the mounting density of the sockets 3 illustrated in FIG. 1 through FIG. 3 on the burn-in board 1 due to the structures of the sockets 3 illustrated in FIG. 1 through FIG. 3.

That is, it is necessary to form electric circuits for applying the burn-in process to the electronic components such as the semiconductor packages 4, on the burn-in board 1. Therefore, elements such as resistors for a lead-connecting process of the semiconductor package 4 are frequently mounted on the burn-in board 1. With a structure where the socket 3 is mounted on the burn-in board 1 by inserting the contacts 3b to the through holes 6 formed in the burn-in board 1, the mounting area of the burn-in board 1 where the elements are mounted is positioned outside the area where the socket 3 is mounted. Hence, in a case where the socket 3 is mounted via the through holes 6, the mounting area of the elements is outside the IC socket 3 and therefore improvement of the mounting number is obstructed. Accordingly, it is difficult to increase the mounting density on the burn-in board 1 of the sockets 3.

In order to solve such a problem, a lead frame where un-diced plural semiconductor packages 4 are connected, not diced semiconductor packages 4, may be connected to the burn-in board 1. With this structure, since the number of the semiconductor packages 4 connected to a single lead frame is plural, it is possible to handle the semiconductor packages 4 in a lump so that the number of processes can be decreased.

However, in this structure, pitches of individual semiconductor packages 4 connected to the lead frame are narrow. Therefore, it is difficult to provide the contacts 3b of the socket 3 having spring properties in the narrow area. In addition, since processing conditions with high precision are requested for development of a small sized socket, processing cost may be high.

In addition, a probe pin, instead of the contact 3b having the spring property, may be used as a method for electrically connecting to the leads 4a provided to the semiconductor package 4 with narrow pitches. However, the price of a single probe pin is higher than that of the contact 3b and the number of assembling processes of the probe pin is greater than that of the contact 3b. Therefore, the manufacturing cost may be increased in an electrical connection to the lead 4a of the semiconductor package 4 by using the probe pin.

In addition, in a case discussed in Japanese Patent No. 2920859 where the IC lead is pressed by the pressing part of the lid part, the lead is pressed by the surface of the pressing part. Therefore, a large force may be required for removing an oxide film formed on the lead for electrical connection and thereby plastic deformation of the lead may occur.

SUMMARY

According to an aspect of the invention, a component for a testing device for an electronic component includes a testing board; a projection electrode provided on a main surface of the testing board; a positioning part provided on the main surface of the testing board, the positioning part being configured to position the electronic component; and a pressing part configured to press the electronic component being positioned by the positioning part and make a lead part of the electronic component come in contact with the projection electrode so that the lead part is elastically deformed and made come in contact with the projection electrode.

According to another aspect of the invention, a testing method of an electronic component includes mounting a lead frame on a testing board, the lead frame being where plural electronic components are coupled; pressing the electronic component coupled to the lead frame and making a lead part of the electronic component come in contact with a projection electrode so that the lead part is elastically deformed and in contact with the projection electrode; and performing an electric test of the electronic component via the projection electrode.

Additional objects and advantages of the embodiments will be set forth in part in the description which follows, and in part will be obvious from the description, or may be learned by practice of the invention.

The object and advantages of the invention will be realized and attained by means of the elements and combinations particularly pointed out in the appended claims.

It is to be understood that both the foregoing general description and the following detailed description are exemplary and explanatory and are not restrictive of the invention as claimed.

DETAILED DESCRIPTION OF THE PREFERRED EMBODIMENTS

Preferred embodiments of the present invention will be explained with reference to accompanying drawings.

First Embodiment

Figure 4:
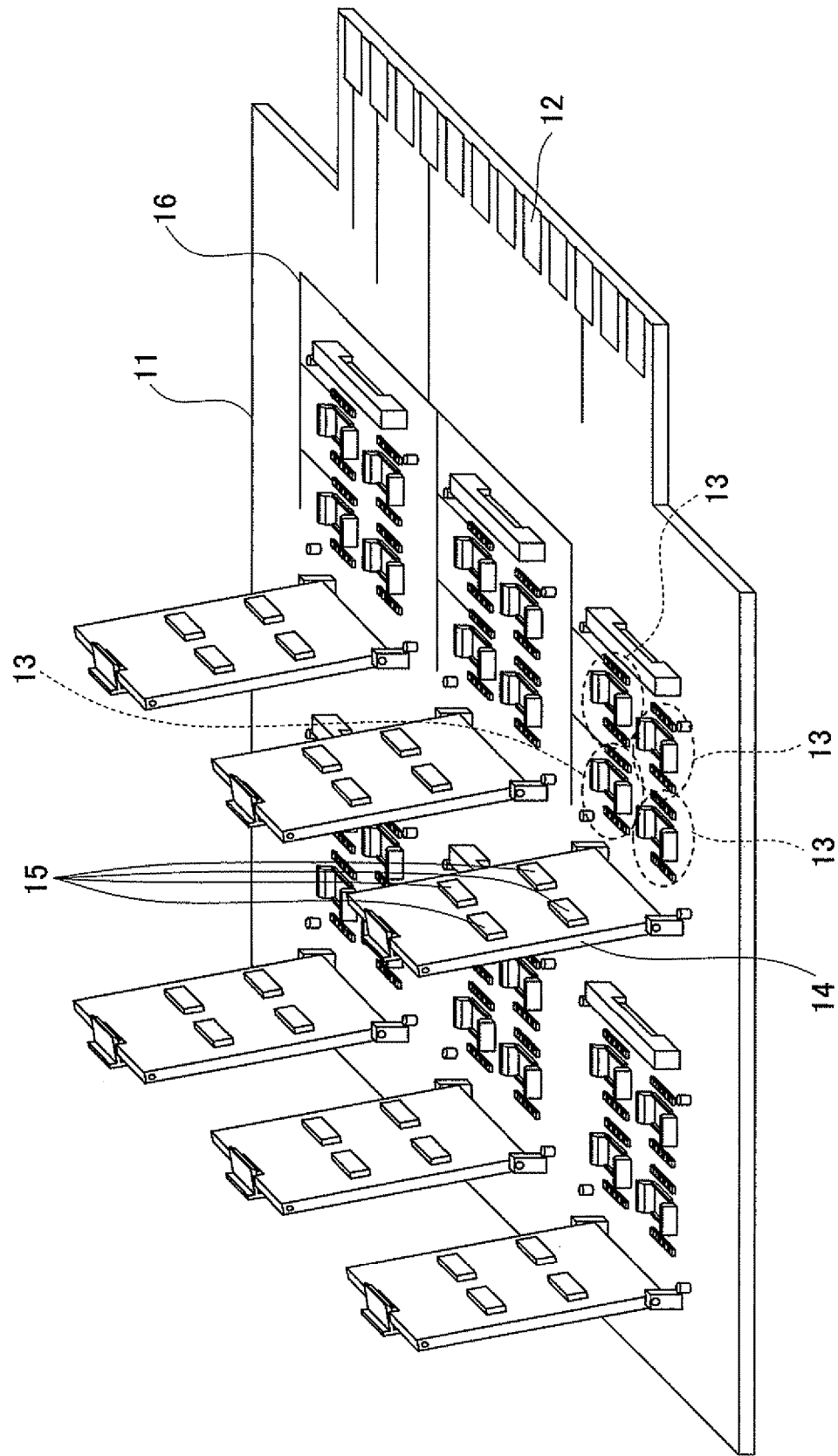
FIG. 4 is a perspective view of a burn-in board of a first embodiment.

A burn-in board 11 which is an example of a component for a testing device of a first embodiment is illustrated in FIG. 4. The burn-in board 11 is used for a burn-in process wherein an accelerated test is performed so that temperature and voltage stresses are applied to the semiconductor element.

An edge terminal part 12 is provided at one end part of the burn-in board 11 illustrated in FIG. 4. The edge terminal part 12 is connected to a burn-in apparatus not illustrated in FIG. 4. In addition, a large number of (24 in an example illustrated in FIG. 4) contactors 13 are mounted on a part of a main surface of the burn-in board 11 other than the edge terminal part 12. A semiconductor package as an example of an electronic component is mounted on one of the contactors 13.

Plural (six in the example shown in FIG. 4) pressing plates 14 are provided on the main surface of the burn-in board 11 so as to rotate approximately 90 degrees. When a single pressing plate 14 is positioned substantially in parallel with the main surface of the burn-in board 11, plural (four in the example illustrated in FIG. 4) pressing blocks (pressing members) 15 provided on one main surface of the pressing plate 14 come in contact with upper surface of the semiconductor package 17 (see FIG. 5) which are electronic components mounted on the contactors 13.

Figure 1:
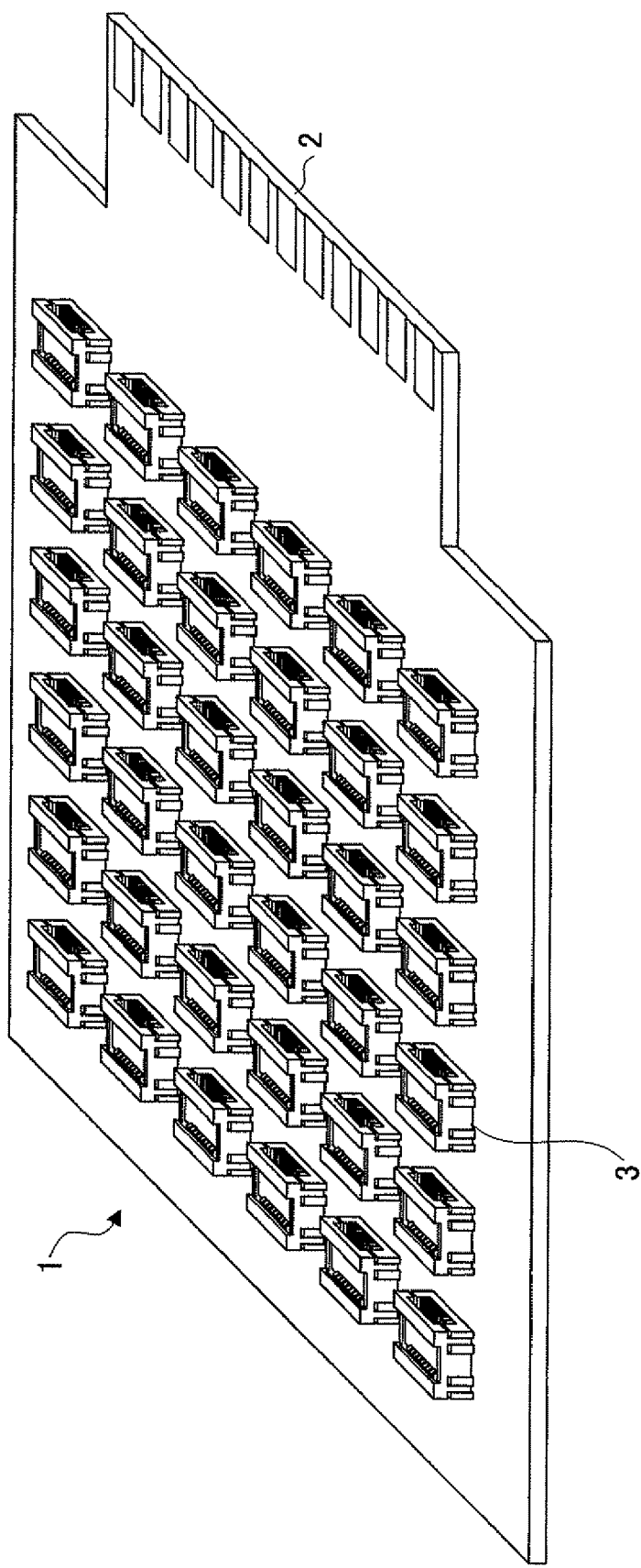
FIG. 1 is a perspective view of a related art burn-in board where IC sockets are provided.

The contactor 13 is electrically connected to the edge terminal part 12 by a wiring pattern 16 (illustration of a part of the wiring pattern 16 is omitted for the convenience of viewing (easier to grasp) in FIG. 1). A circuit including an electronic component such as a resistor (not illustrated) is formed on the way of the wiring pattern 16. When a signal and electric power are supplied from the burn-in apparatus (not illustrated) to the edge terminal part 12, it is possible to supply the signal and the electric power to the circuit, the electronic component, and the semiconductor package 17 mounted on the contactor 13.

Figure 5:
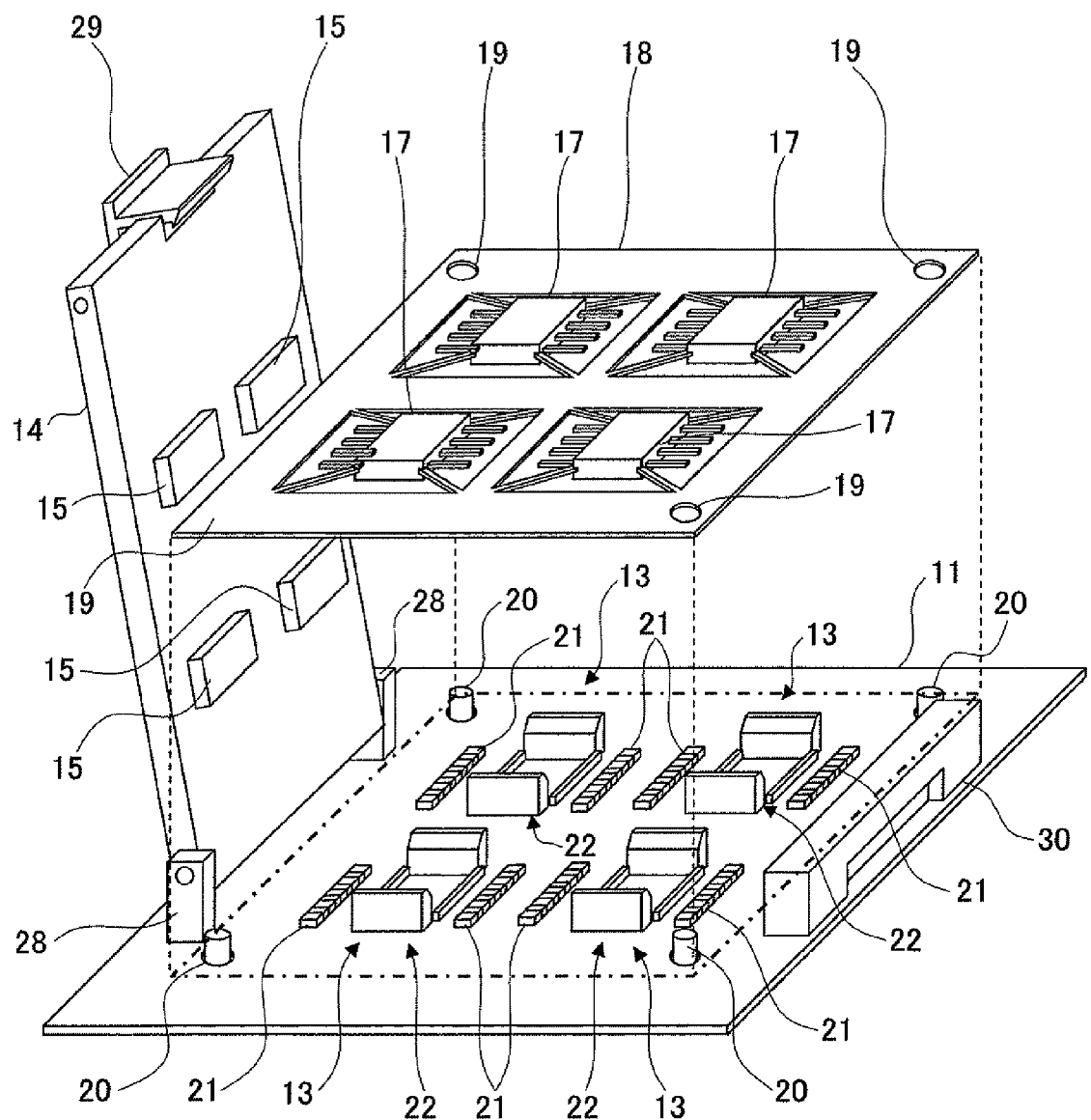
FIG. 5 is a partial expanded view of the burn-in board illustrated in FIG. 4.

A partial expanded view of the burn-in board 11 illustrated in FIG. 4 is illustrated in FIG. 5. For the convenience for viewing, illustration of the wiring pattern 16 is omitted in FIG. 5.

As illustrated in FIG. 5, a single lead frame 18 where four semiconductor packages 17 are connected is attached to the burn-in board 11 so that four semiconductor packages 17 are mounted on the four contactors 13. More specifically, the lead frame 18 is attached to the burn-in board 11 by lowering the lead frame 18 from a place above the burn-in board 11 and by inserting four guide pins 20 provided at the burn-in board 11 into guide holes 19 formed in the vicinities of four corners of the lead frame 18. In FIG. 5, an area indicated by an one dotted line is an area of the burn-in board 11 where the lead frame 18 is attached.

Figure 6:
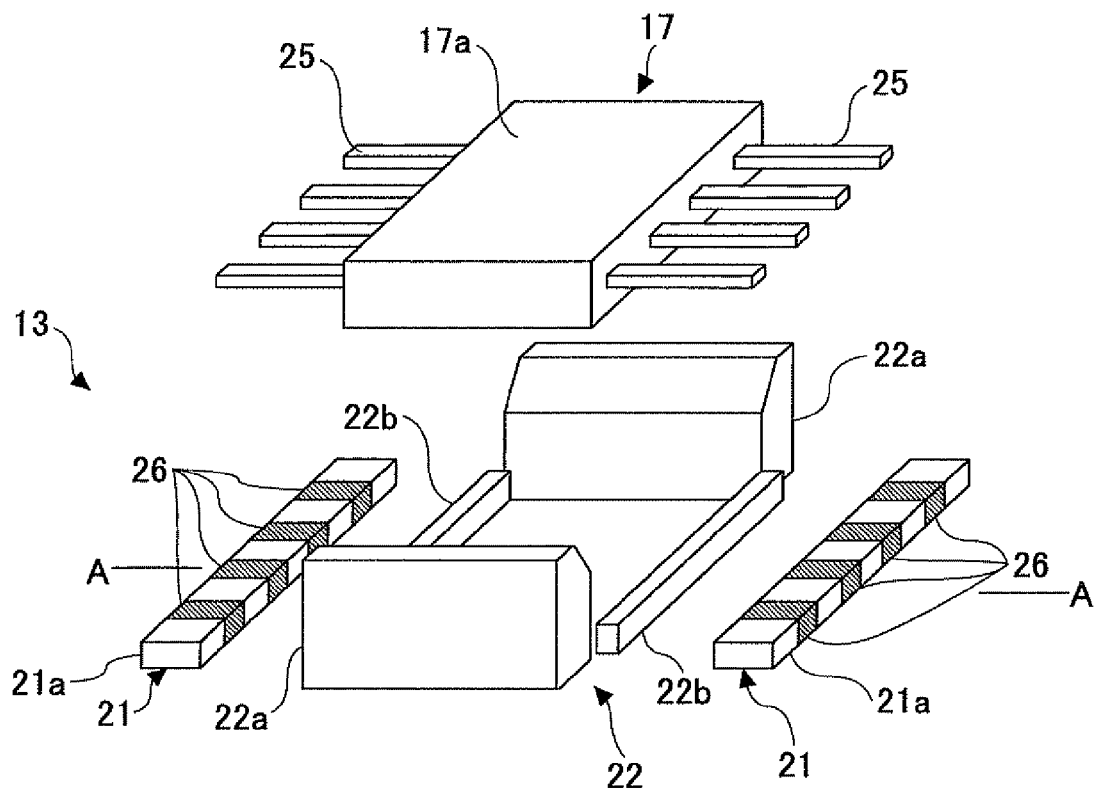
FIG. 6 is a perspective view of a contactor illustrated in FIG. 5 and a semiconductor package.

Here, FIG. 6 is also referred to. FIG. 6 is a perspective view of a single contactor 13 and the semiconductor package 17 provided on the contactor 13. The contactor 13 includes contact boards 21 and a guide part 22.

The guide part 22 includes guide blocks 22a facing each other and guide block connecting parts 22b configured to connect two guide blocks 22a to each other. When the lead frame 18 where the semiconductor packages 17 are connected is attached to the burn-in board 11, a resin part (main body) 17a configured to seal the semiconductor element in the semiconductor package 17 is received in an area surrounded by the guide blocks 22a and the guide block connecting parts 22b. The area surrounded by the guide blocks 22a and the guide block connecting parts 22b is slightly larger than the resin part 17a of the semiconductor package 17. The guide part 22 functions as a positioning part of the semiconductor package 17.

Two contact boards 21 are provided along a longitudinal direction of the guide block connecting parts 22b and face each other.

The height of the contact boards 21 is set so that the lead parts 25 provided at two side surfaces facing each other of the resin part 17a of the semiconductor package 17 come in contact with the upper surfaces of the contact boards 21 when the lead frame 18 where the semiconductor packages 17 are connected is attached to the burn-in board 11.

The contact board 21 has a base member made of an insulation material 21a such as glass epoxy resin or FRP (Fiber Reinforced Plastic). Pads (electrodes) 26 are formed on external circumferential surfaces (hatched portions of the contact board 21 in FIG. 6) of parts of the contact board 21 where the lead parts 25 come in contact. The pads (electrodes) 26 are made of a copper (Cu) foil and gold (Au) plating or a copper (Cu) foil and nickel-gold (Ni—Au) plating.

Figure 7:
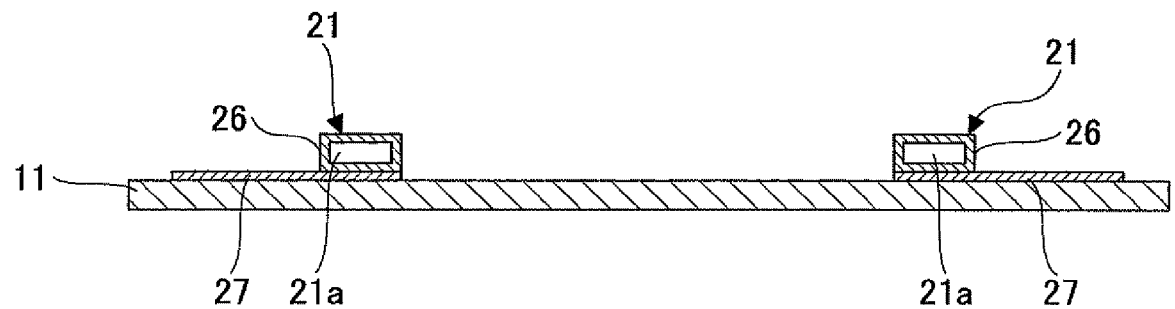
FIG. 7 is a cross-sectional view taken along a line A-A of FIG. 6.

FIG. 7 is a cross-sectional view taken along a line A-A of FIG. 6. For the convenience for viewing, illustration of the guide part 22 is omitted in FIG. 7. As illustrated in FIG. 7, the contact boards 21 are connected to lands 27 provided on the wiring pattern 16 on the burn-in board 11 by soldering.

Referring back to FIG. 5, rotational axial parts 28 are attached to the main surface of the burn-in board 11. The rotational axial parts 28 are connected to a pressing plate 14. The pressing plate 14 can be rotated with respect to the rotational axial parts 28 approximately 90 degrees. A latch part 29 is provided at an end part of the pressing plate 14 which is situated opposite to the rotational axial parts 28. A block part 30 which can be connected to the latch part 29 is provided at a portion facing the latch part 29 on the main surface of the burn-in board 11 when the pressing plate 14 is positioned substantially in parallel with the main surface of the burn-in board 11. Plural (four in the example illustrated in FIG. 4) pressing blocks 15 made of resin are provided on a main surface of the pressing plate 14.

When the pressing plate 14 is rotated approximately 90 degrees so as to be positioned substantially in parallel with the main surface of the burn-in board 11 after the lead frame 18 where the semiconductor packages 17 are connected is attached to the burn-in board 11, the pressing blocks 15 come in contact with the upper surfaces of the resin parts 17a of the semiconductor packages 17 mounted on the contactors 13. When the latch part 29 and the block part 30 are connected to each other, the resin parts 17a of the semiconductor packages 17 are pressed by the pressing blocks 15 of the pressing plate 14 and this pressing state is maintained.

Figure 8:
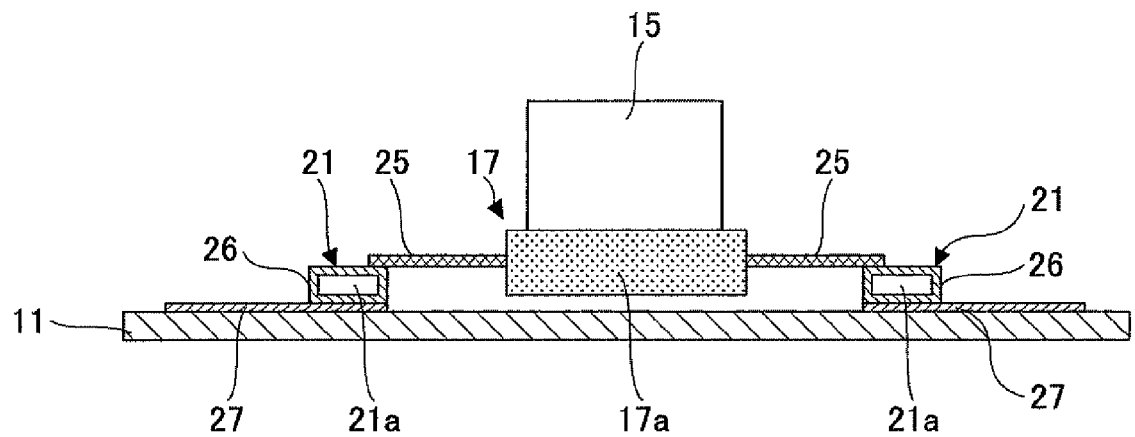
FIG. 8 is a cross-sectional view of a state where the semiconductor package is provided on the contactor illustrated in FIG. 6.
Figure 9:
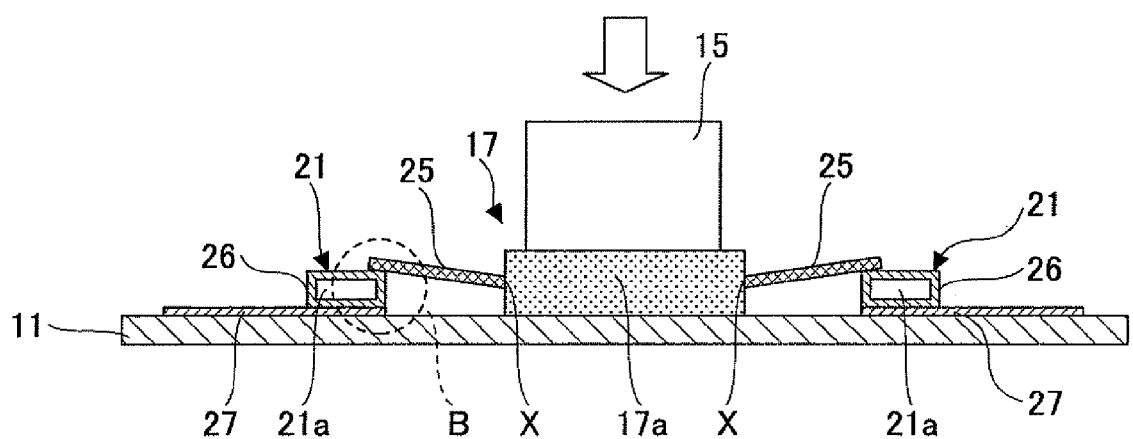
FIG. 9 is a cross-sectional view of a pressing state where a resin part of the semiconductor package illustrated in FIG. 8 is pressed down.

Next, a connecting structure of the semiconductor packages 17 to the contactors 13 mounted on the burn-in board 11 having the above-mentioned structure is discussed with reference to FIG. 8 through FIG. 11. In FIG. 8 and FIG. 9, for the convenience for viewing, only one pressing block 15 is illustrated in the pressing plate 14.

When the lead frame 18 where the semiconductor packages 17 are connected is attached to the burn-in board 11 and the pressing plate 14 is rotated approximately 90 degrees so as to be positioned substantially in parallel with the main surface of the burn-in board 11, as illustrated in FIG. 8, the pressing blocks 15 come in contact with the upper surfaces of the resin parts 17a of the semiconductor packages 17 mounted on the contactors 13. At this time, head end parts of the lead parts 25 of the semiconductor packages 15 run onto the upper surfaces of the contact boards 21.

Figure 10:
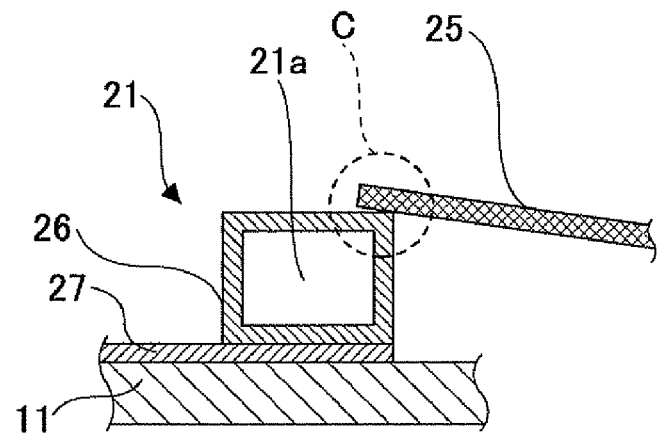
FIG. 10 is an expanded view of a part surrounded by a dotted line B in FIG. 9.

When the latch part 29 of the pressing plate 14 and the block part 30 are connected to each other, as illustrated by an arrow in FIG. 9, the resin part 17a of the semiconductor package 17 is pushed down and pressed by the pressing block 15 of the pressing plate 14 and this pressing state is maintained. As a result of this, as illustrated in FIG. 9 and FIG. 10, the lead parts 25 of the semiconductor package 17 are elastically deformed in a state where a connecting point X (see FIG. 9) of the lead parts 25 and the resin part 17a of the semiconductor package 17 is a fulcrum. Only corner parts of the pads 26 come in contact with lower surfaces of the lead parts 25 (see FIG. 10). Contacts between the lead parts 25 and the corner parts of the pads 26 are maintained by elastic forces of the lead parts 25.

Figure 11:
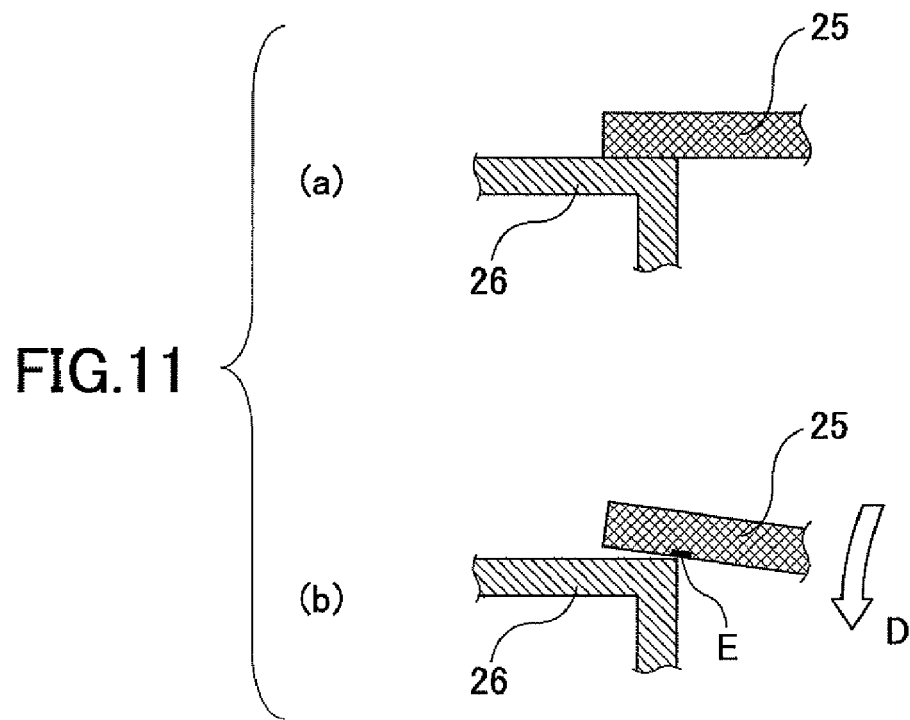
FIG. 11 is an expanded view of a part surrounded by a dotted line C in FIG. 10.

Contact between the lead part 25 and the pad 26 formed on the contact board 21 is illustrated in FIG. 11. FIG. 11(a) is an expanded view of a portion surrounded by a dotted line C in FIG. 10 before deformation as illustrated in FIG. 8. FIG. 11(b) is an expanded view of the portion surrounded by the dotted line C after deformation as illustrated in FIG. 10.

As illustrated in FIG. 11(a), when the lead frame 18 where the semiconductor packages 17 are connected is attached to the burn-in board 11 and the pressing plate 14 is rotated approximately 90 degrees so as to be positioned substantially in parallel with the main surface of the burn-in board 11 (before deformation as illustrated in FIG. 8), the head end part of the lead part 25 of the semiconductor package 17 runs onto the upper surface of the contact board 21.

Furthermore, when the latch part 29 and the block part 30 are connected to each other and the resin part 17a of the semiconductor package 17 is pressed down by the pressing block 15 of the pressing plate 14 (after deformation as illustrated in FIG. 10), as illustrated in FIG. 11(*b*), the lead part 25 of the semiconductor package 17 is elastically deformed and bent. The corner part of the pad 26 is forced into the lower surface of the lead part 25 due to the elastic force of the lead part 25.

As illustrated by an arrow D in FIG. 11(*b*), the lead part 25 moves slightly obliquely down to partially restore its status before elastic deformation. As a result of this, an oxide film formed on a lower surface of the lead part 25, part of an oxide film formed on the lead part 25, is removed by the corner part of the pad 26. In FIG. 11(*b*), a portion E indicated in black color illustrates a state where the oxide film is removed by movement of the lead part 25. Although the oxide film obstructs conductivity, it is possible to achieve electrical conductivity between the lead part 25 of the semiconductor package 17 and the pad 26 of the contact board 21 by partially removing the oxide film of the lead part 25.

Thus, in the burn-in board 11 of the first embodiment, electrical contact between the semiconductor package 17 as a testing subject and the burn-in board 11 is achieved via the contact board 21 mounted on the burn-in board 11.

Figure 3:
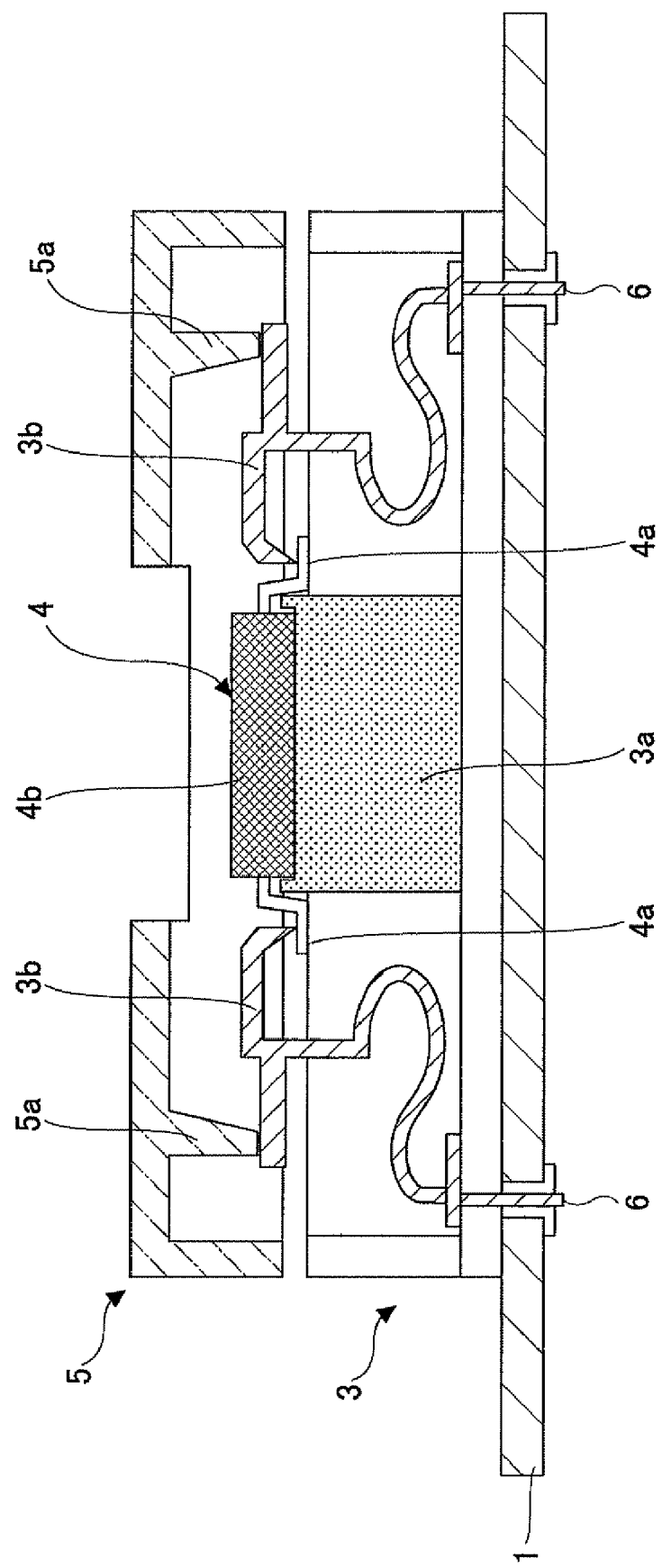
FIG. 3 is a cross-sectional view of the IC socket illustrated in FIG. 1 and the semiconductor package.

Since it is possible to easily make the width of the contact board 21 small, it is possible to make the area of the burn-in board 11 where the contact board 21 is mounted small. In addition, the structure of the first embodiment is simpler than the structure illustrated in FIG. 3 where the contacts 3b are provided. Accordingly, it is possible to mount the contact boards 21 at high density. Hence, it is possible to increase the number of semiconductor packages 17 which are the electrical connection subjects of the contact boards 21 and the testing subjects.

Figure 2:
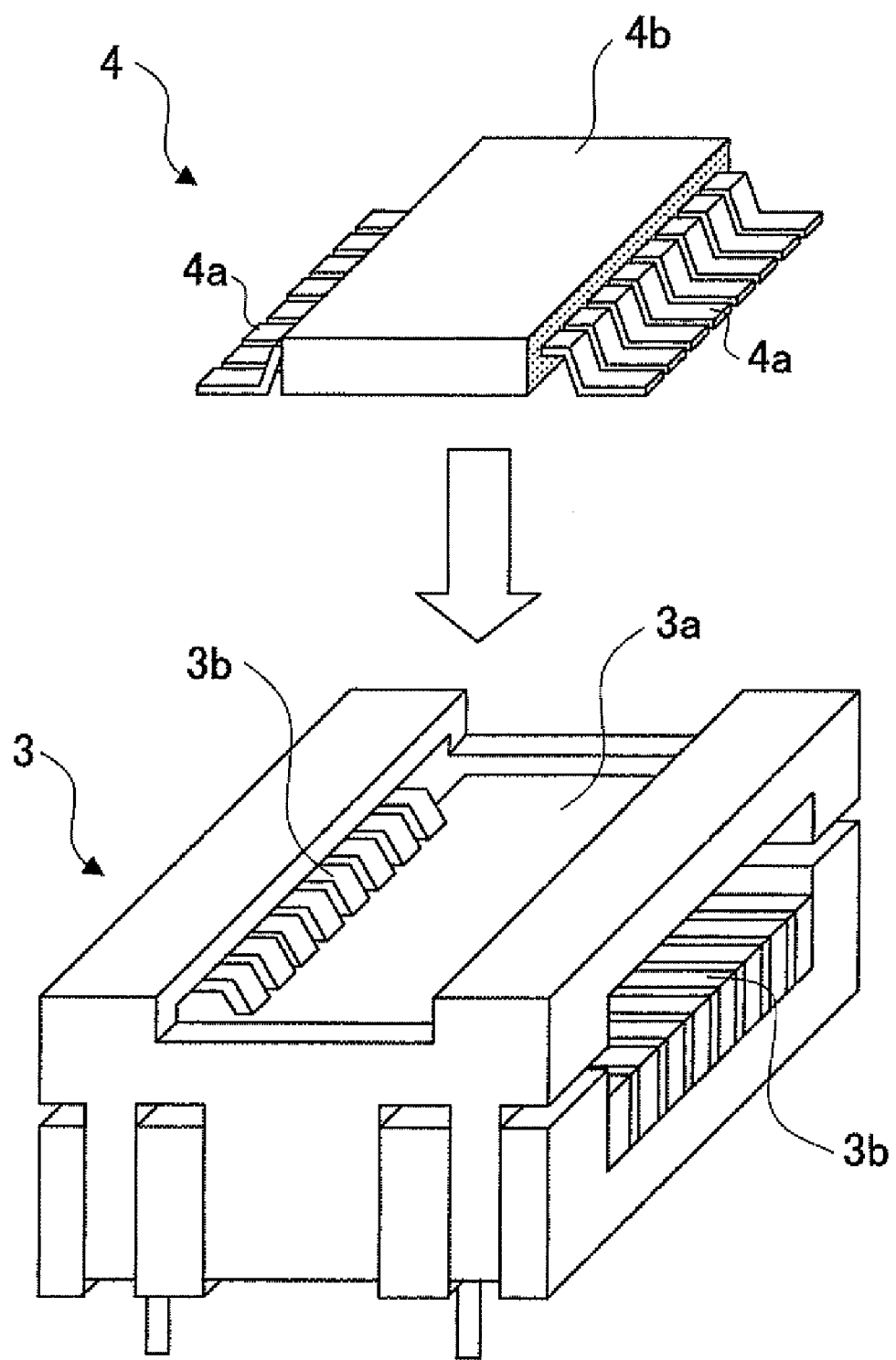
FIG. 2 is a perspective view of the IC socket illustrated in FIG. 1 and a semiconductor package which is installed in the IC socket.

In addition, in the socket 3 illustrated in FIG. 2, if the automatic machine is used, only a single or several semiconductor packages 4 can be mounted on the burn-in board 1. On the other hand, in this example, the semiconductor packages 17 can be mounted on the contact boards 21 at lead frame units, namely approximately 30 pieces. Hence, it is possible to perform mounting operations efficiently and at a low cost.

Furthermore, according to the first embodiment, the lead frame 18 where plural semiconductor packages 17 are connected can be attached to the burn-in board 11. Therefore, it is possible to increase the number of the semiconductor packages 17 as the testing subjects without increasing the number of process steps.

In addition, according to the structure of the first embodiment, the oxide film formed on the lower surface of the lead part 25, part of the oxide film formed on the lead part 25, is removed by the corner part of the pad 26 so that it is possible to achieve electrical conductivity between the lead part 25 of the semiconductor package 17 and the pad 26 of the contact board 21. Therefore, compared to the structure discussed in Japanese Patent No. 2920859 where the lead is pressed by a surface of the pressing part, a large force is not required and plastic deformation of the lead part 25 does not occur.

In the meantime, in the above-discussed example, an area surrounded by the guide blocks 22a and the guide block connection part 22b (see FIG. 6) is slightly larger than the resin part 17a of the semiconductor package 17. The resin part 17a sealing the semiconductor element in the semiconductor package 17 is received in this area. However, the present invention is not limited to this structure.

Figure 12:
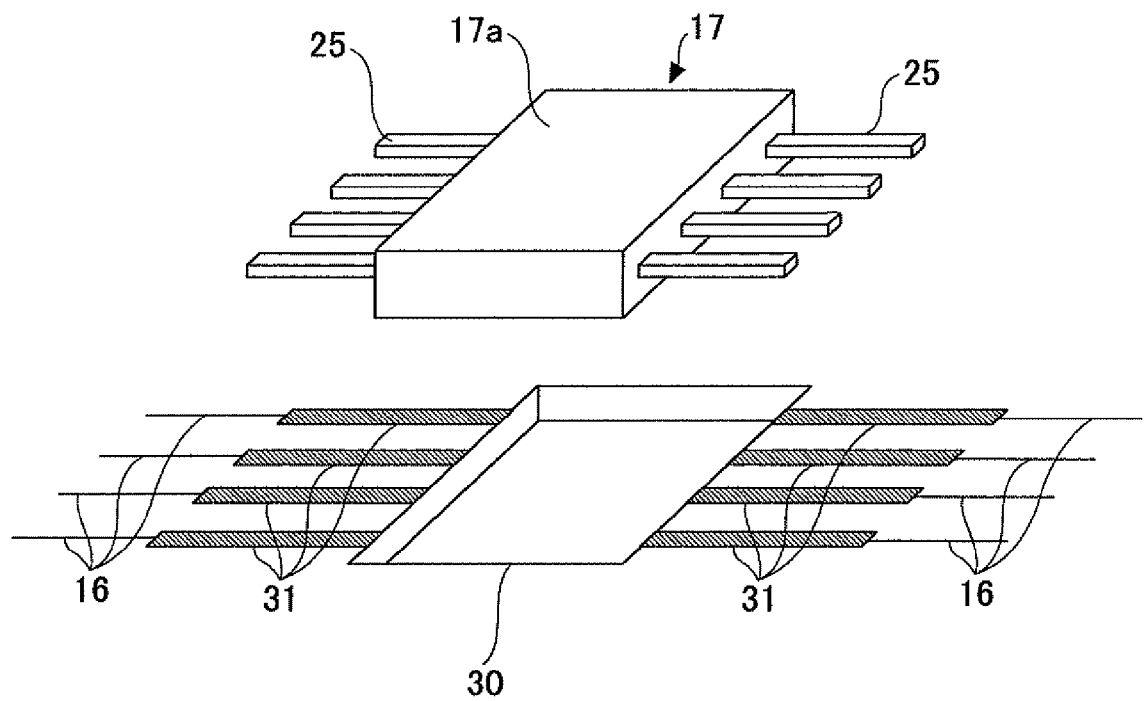
FIG. 12 is a view for explaining a first modified example of the first embodiment.

In a first modified example illustrated in FIG. 12 of the first embodiment, a concave part 30 is formed in the burn-in board 11. The concave part 30 has an opening surface with a substantially rectangular shaped configuration. The opening surface has an area slightly larger than the resin part 17a of the semiconductor package 17. In addition, contact pads (electrodes) 31 are provided along sides facing each other of the opening surface of the concave part 30. The contact pads 31 are connected to the wiring pattern 16.

The contact pad 31 is made of, for example, a copper (Cu) foil and gold (Au) plating or a copper (Cu) foil and nickel-gold (Ni—Au) plating. The contact pads 31 are situated in positions of the lead parts 25 provided on two side surfaces facing each other of the resin part 17a of the semiconductor package 17 when the resin part 17a of the semiconductor package 17 is positioned the concave part 30.

The depth of the concave part 30 is set whereby the lead parts 25 come in contact with the contact pads 31 when the resin part 17a of the semiconductor package 17 is positioned the concave part 30. In other words, the concave part 30 functions as a guide part.

Under this structure, when the pressing plate 14 is rotated approximately 90 degrees so as to be positioned substantially in parallel with the main surface of the burn-in board 11 after the lead frame 18 (see FIG. 5) where the semiconductor packages 17 are connected is attached to the burn-in board 11, the pressing block 15 of the pressing plate 14 comes in contact with the upper surface of the resin part 17a of the semiconductor package 17 mounted on the contactor 13. At this time, a head end part of the lead part 25 of the semiconductor package 17 runs onto the upper surface of the contact pad 31.

In addition, when the latch part 29 and the block part 30 (see FIG. 5) are connected to each other and the resin part 17a of the semiconductor package 17 is pressed down by the pressing block 15 of the pressing plate 14, the lead parts 25 of the semiconductor package 17 are elastically deformed and bent. A contact point with an angle of the circumferential edge of the opening surface of the concave part 30 and the contact pad 31 is forced into the lower surface of each of the lead part 25 due to the elastic force of the lead part 25. Furthermore, the lead parts 25 slightly move so as to partially restore their status before the elastic deformation.

As a result of this, oxide films formed on lower surfaces of the lead parts 25, part of the oxide films formed on the lead parts 25, are removed by the edge parts of the contact pads 31. Because of this, it is possible to achieve electrical conductivity between the lead parts 25 of the semiconductor package 17 and the contact pads 31.

In the example illustrated in FIG. 6, the concave part 30 illustrated in FIG. 12, instead of the guide part 22 may be used.

Figure 13:
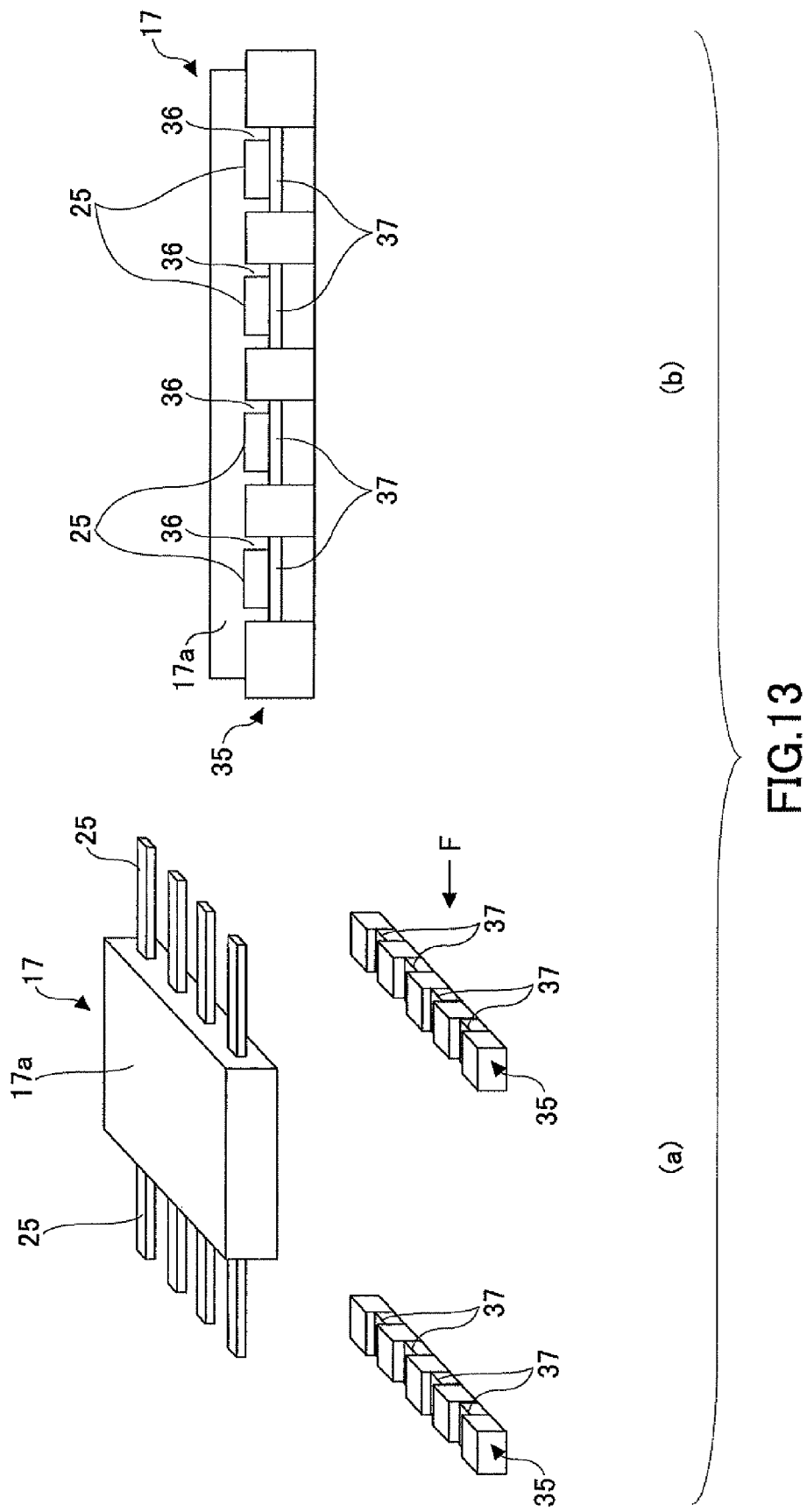
FIG. 13 is a view for explaining a second modified example of the first embodiment.

In the meantime, an embodiment of the present invention can be applied to the example illustrated in FIG. 13. FIG. 13(*b*) is a view seen in a direction indicated by an arrow F in a state where the lead parts 25 of the semiconductor package 17 illustrated in FIG. 13(*a*) are provided on the contact boards 35.

In a second modified example illustrated in FIG. 13 of the first embodiment, two contact boards 35 are separately provided with a designated length so as to face each other. The contact boards 35 have base members made of insulation materials such as glass epoxy resin or FRP (Fiber Reinforced Plastic).

Plural (four in the example illustrated in FIG. 13) step parts 36 are formed with a designated length in a longitudinal direction of the contact board 35. Pads (electrodes) 37 are formed on bottom surfaces of the step parts 36. The pads (electrodes) 37 are made of, for example, a copper (Cu) foil and gold (Au) plating or a copper (Cu) foil and nickel-gold (Ni—Au) plating.

The step parts 36 are situated in positions of the lead parts 25 provided on two side surfaces facing each other of the resin part 17a of the semiconductor package 17 when the resin part 17a of the semiconductor package 17 is positioned between the contact boards 35 facing each other.

The depths of the step parts 36 are set whereby the lead parts 25 provided on two side surfaces facing each other of the resin part 17a of the semiconductor package 17 come in contact with the bottom surfaces of the step parts 36 when the lead frame 18 where the semiconductor packages 17 are connected is attached to the burn-in board 11. In addition, the widths of the step parts 36 are slightly larger than the lead parts 25 of the semiconductor package 17. In other words, the step parts 36 formed in the contact boards 35 function as guide parts.

Under this structure, when the lead frame 18 (see FIG. 5) where the semiconductor packages 17 are connected is attached to the burn-in board 11 and the pressing plate 14 is rotated approximately 90 degrees so as to be positioned substantially in parallel with the main surface of the burn-in board 11, the pressing block 15 of the pressing plate 14 comes in contact with the upper surface of the resin part 17a of the semiconductor package 17 mounted on the contactor 13. At this time, a head end part of the lead part 25 of the semiconductor package 17 runs onto the upper surface of the pad 37 formed on the bottom surface of the step part 36.

In addition, when the latch part 29 and the block part 30 (see FIG. 5) are connected to each other and the resin part 17a of the semiconductor package 17 is pressed down by the pressing block 15 of the pressing plate 14, the lead part 25 of the semiconductor package 17 are elastically deformed and bent. A circumferential edge part of the pad 37 is forced into the lower surface of the lead part 25 due to the elastic force of the lead part 25. Furthermore, the lead parts 25 slightly move so as to partially restore their status before the elastic deformation.

As a result of this, oxide films formed on lower surfaces of the lead parts 25, part of the oxide films formed on the lead parts 25, are removed by the circumferential edge parts of the pads 37. Because of this, it is possible to achieve electrical conductivity between the lead parts 25 of the semiconductor package 17 and the pads 37.

Figure 14:
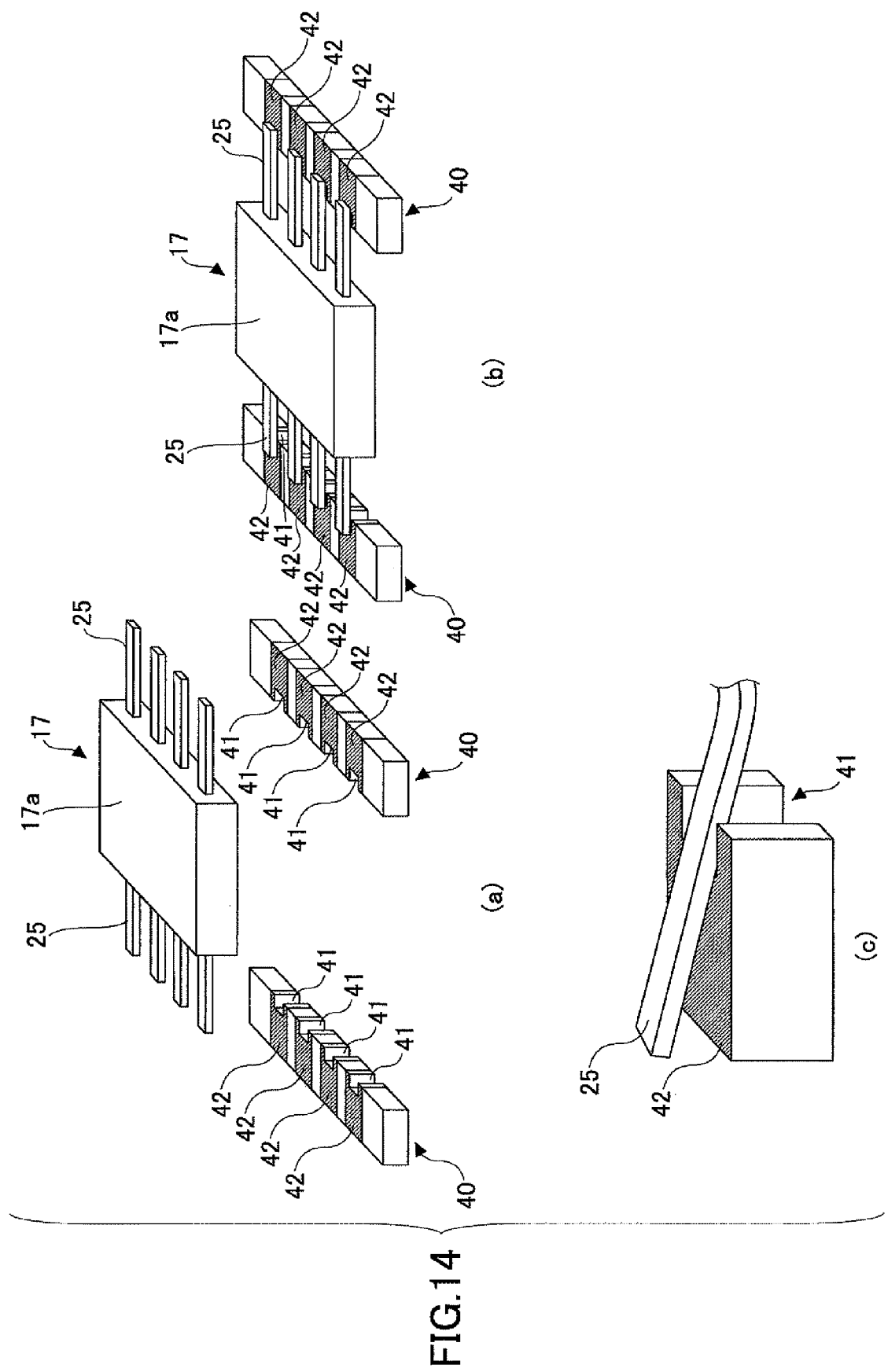
FIG. 14 is a view for explaining a third modified example of the first embodiment.

In the meantime, an embodiment of the present invention can be applied to the example illustrated in FIG. 14. FIG. 14(b) illustrates a state where the lead parts 25 of the semiconductor package 14 as illustrated in FIG. 14(a) before deformation. FIG. 14(c) is a partially expanded view of contact of the lead parts 25 and the contact board 40 after deformation where the resin part 17a of the semiconductor package 17 is pressed down further than before deformation as illustrated in FIG. 14(b).

In a third modified example illustrated in FIG. 14 of the first embodiment, two contact boards 40 are separately provided with a designated length so as to face each other. The contact boards 40 have base members made of insulation materials such as glass epoxy resin or FRP (Fiber Reinforced Plastic).

Plural concave parts 41 are formed with a designated length in a longitudinal direction of the contact board 40. Pads (electrodes) 42 are formed on portions of the upper surface of the contact board 40 where the concave parts 41 are formed. The pads (electrodes) 42 are made of, for example, a copper (Cu) foil and gold (Au) plating or a copper (Cu) foil and nickel-gold (Ni—Au) plating.

The concave parts 41 are situated in positions of the lead parts 25 provided on two side surfaces facing each other of the resin part 17a of the semiconductor package 17 when the resin part 17a of the semiconductor package 17 is positioned between the contact boards 40 facing each other.

The widths of the concave parts 41 are slightly larger than the lead parts 25 of the semiconductor package 17. In other words, the concave parts 41 formed in the contact board 40 function as guide parts.

Under this structure, when the lead frame 18 (see FIG. 5) where the semiconductor packages 17 are connected is attached to the burn-in board 11 and the pressing plate 14 is rotated approximately 90 degrees so as to be positioned substantially in parallel with the main surface of the burn-in board 11, the pressing block 15 of the pressing plate 14 comes in contact with the upper surface of the resin part 17a of the semiconductor package 17 mounted on the contactor 13. At this time, head end parts of the lead parts 25 of the semiconductor package 17 run onto the upper surfaces of the pads 42 as illustrated in FIG. 14(b).

In addition, when the latch part 29 and the block part 30 (see FIG. 5) are connected to each other and the resin part 17a of the semiconductor package 17 is pressed down by the pressing block 15 of the pressing plate 14, the lead parts 25 of the semiconductor package 17 are elastically deformed and bent. Edge parts of the concave parts 41 of the pad 37 are forced into the lower surfaces of the lead parts 25 due to the elastic force of the lead parts 25. Furthermore, the lead parts 25 slightly move so as to partially restore their status before the elastic deformation. In addition, the lead parts 25 are engaged with the concave parts 41 of the pads 42 so that the semiconductor package 17 is positioned.

As a result of this, oxide films formed on lower surfaces of the lead parts 25, part of the oxide films formed on the lead parts 25, are removed by the circumferential edge parts of the pads 42. Because of this, it is possible to achieve electrical conductivity between the lead parts 25 of the semiconductor package 17 and the pads 42.

In order for the lead part 25 to easily engage the concave part 41 of the pad 42, a taper may be provided between the pad 42 and the concave part 41.

Figure 15:
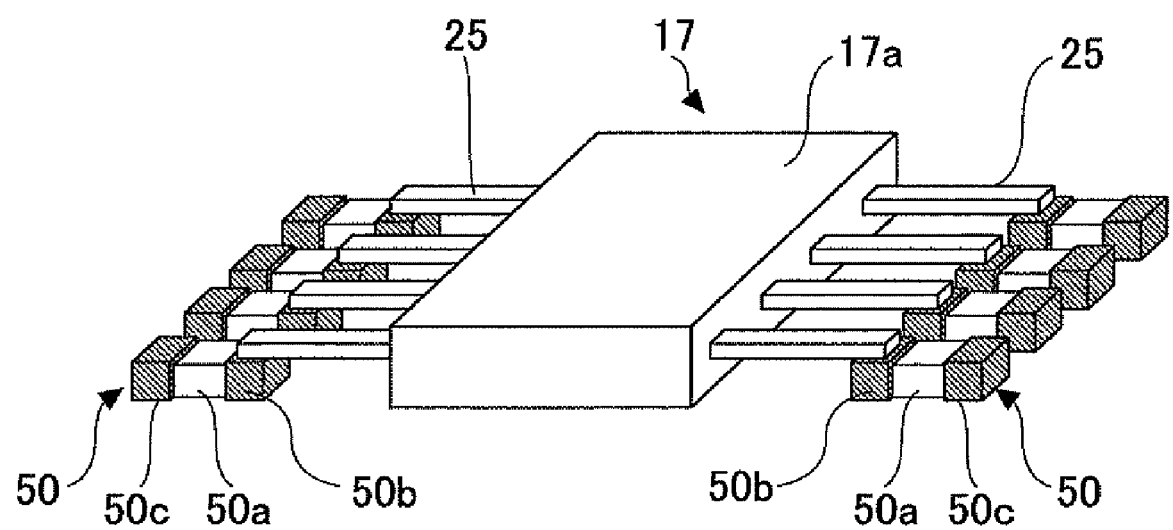
FIG. 15 is a view for explaining a fourth modified example of the first embodiment.

In the meantime, an embodiment of the present invention can be applied to the example illustrated in FIG. 15.

In a third modified example illustrated in FIG. 15 of the first embodiment, plural (four in an example illustrated in FIG. 15) chip components 50 instead of the contact board are provided at one side in a line state and plural (four in an example illustrated in FIG. 15) chip components 50 instead of the contact board are provided at another side in a line state.

Each of the chip components 50 includes an element part 50a such as a resistance element or a condenser element and pad (electrode) parts 50b and 50c. The pad (electrode) parts 50b and 50c are provided one at each end of the element part 50a and have rectangular-shaped configurations. The pad parts 50b are made of, for example, a copper (Cu) foil and gold (Au) plating or a copper (Cu) foil and nickel-gold (Ni—Au) plating.

The pad parts 50b of the chip components 50 positioned at the resin part side 17a of the semiconductor package 17 are situated in positions of the lead parts 25 provided on two side surfaces facing each other of the resin part 17a of the semiconductor package 17 when the resin part 17a of the semiconductor package 17 is positioned between the lines of the pad parts 50b facing each other.

Under this structure, when the lead frame 18 (see FIG. 5) where the semiconductor packages 17 are connected is attached to the burn-in board 11 and the pressing plate 14 is rotated approximately 90 degrees so as to be positioned substantially in parallel with the main surface of the burn-in board 11, the pressing block 15 of the pressing plate 14 comes in contact with the upper surface of the resin part 17a of the semiconductor package 17 mounted on the contactor 13. At this time, head end parts of the lead parts 25 of the semiconductor package 17 run onto the upper surfaces of the pad parts 50b of the chip components 50 as illustrated in FIG. 15.

In addition, when the latch part 29 and the block part 30 (see FIG. 5) are connected to each other and the resin part 17a of the semiconductor package 17 is pressed down by the pressing block 15 of the pressing plate 14, the lead parts 25 of the semiconductor package 17 are elastically deformed and bent. Edge parts of the pad parts 50b of the chip components 50 are forced into the lower surfaces of the lead parts 25 due to the elastic force of the lead part 25. Furthermore, the lead parts 25 slightly move so as to partially restore their status before the elastic deformation.

As a result of this, oxide films formed on lower surfaces of the lead parts 25, part of the oxide films formed on the lead parts 25, are removed by the edge parts of the pad parts 50b. Because of this, it is possible to achieve electrical conductivity between the lead parts 25 of the semiconductor package 17 and the pad parts 50b.

In the example illustrated in FIG. 15, each of the chip components 50 is separately provided. However, for example, a single module may be provided by stacking the chip components 50 and the insulators mutually so as to collect plural chip components 50. With this structure, it is possible to reduce the space necessary for forming the circuit and increase the number of the semiconductor packages 17 to be mounted.

Figure 16:
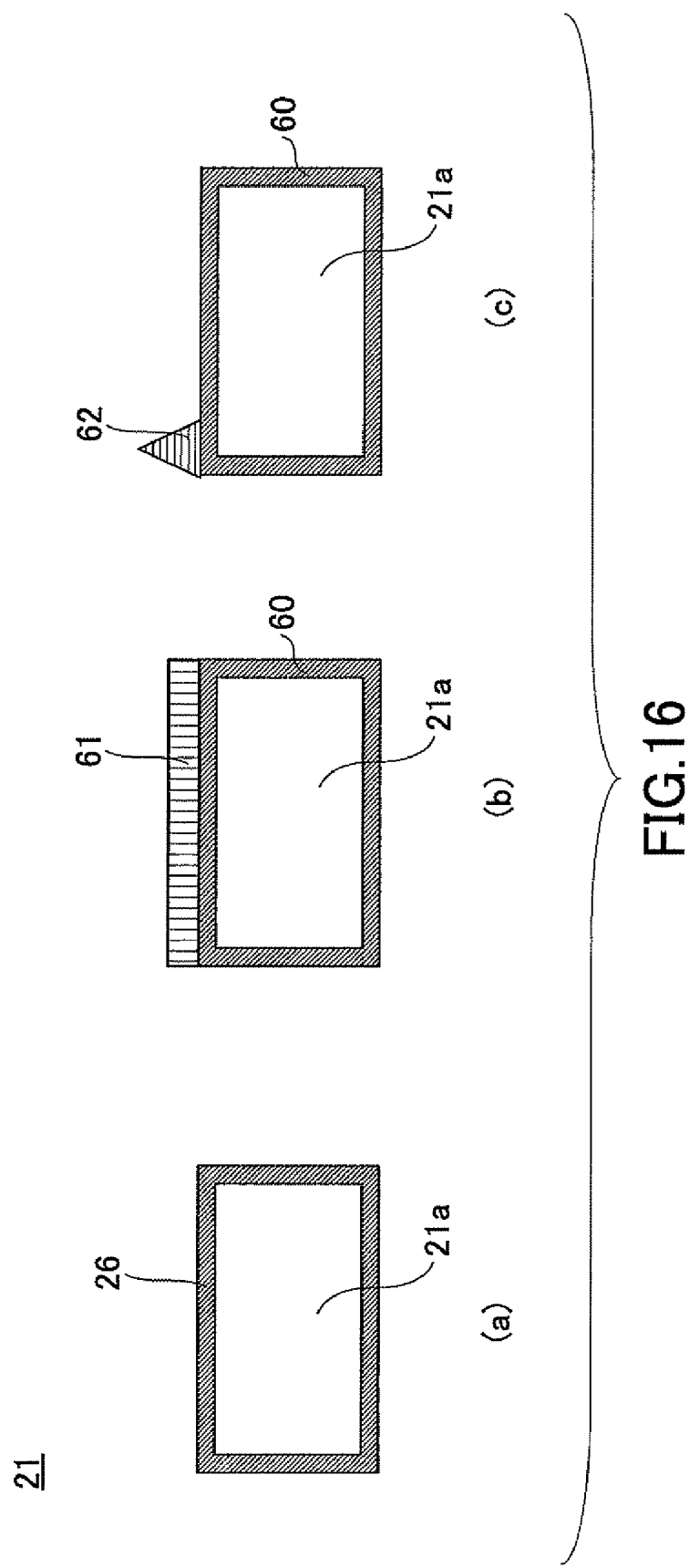
FIG. 16 is a view for explaining fifth and sixth modified examples of the first embodiment.

In the meantime, in the example illustrated in FIG. 7, the contact board 21 has a base member made of an insulation material 21a such as glass epoxy resin or FRP (Fiber Reinforced Plastic). Pads (electrodes) 26 are formed on external circumferential surfaces (hatched portions of the contact board 21 in FIG. 6) of parts of the contact board 21 where the lead parts 25 come in contact. The pads (electrodes) 26 are made of a copper (Cu) foil and gold (Au) plating or a copper (Cu) foil and nickel-gold (Ni—Au) plating. See FIG. 16(a).

However, the present invention is not limited to this example. An embodiment of the present invention may be applied to examples illustrated in FIG. 16(b) and FIG. 16(c).

In a fifth example of the first embodiment illustrated in FIG. 16(b), a first layer 60 is formed on an external circumferential surface of a portion of the contact board 21 where the lead part 25 comes in contact. The first layer 60 is made of, for example, a copper (Cu) foil and gold (Au) plating or a copper (Cu) foil and nickel-gold (Ni—Au) plating which is a material of the pad 26 in the example illustrated in FIG. 16(a). In addition, a second conductive layer 61 made of a conductive material is formed on the first layer 60 situated on the upper surface of the contact board 21. More specifically, the second layer 61 is made of, for example, a material having conductivity and elasticity such as a silicon conductive rubber or a material having conductivity and high hardness such as palladium (Pd) or rhodium (Rh).

Under this structure, when the pressing plate 14 is rotated approximately 90 degrees so as to be positioned substantially in parallel with the main surface of the burn-in board 11 after the lead frame 18 (see FIG. 5) where the semiconductor packages 17 are connected is attached to the burn-in board 11 and when the latch part 29 and the block part 30 (see FIG. 5) are connected to each other and the resin part 17a of the semiconductor package 17 is pressed down by the pressing block 15 of the pressing plate 14, the lead parts 25 of the semiconductor package 17 are elastically deformed and bent. An edge part of the second layer 61 of the contact board 21 is forced into the lower surface of the lead part 25 due to the elastic force of the lead part 25. Furthermore, the lead parts 25 slightly move so as to partially restore their status before the elastic deformation.

As a result of this, oxide films formed on lower surfaces of the lead parts 25, parts of the oxide films formed on the lead parts 25, are removed by the edge parts of the second layers 61 of the contact boards 21. Because of this, it is possible to achieve electrical conductivity between the lead parts 25 of the semiconductor package 17 and the second layer 61 of the contact board 21.

In a sixth modified example illustrated in FIG. 16(c) of the first embodiment, a first layer 60 is formed on an external circumferential surface of a portion of the contact board 21 where the lead part 25 comes in contact. The first layer 60 is made of, for example, a copper (Cu) foil and gold (Au) plating or a copper (Cu) foil and nickel-gold (Ni—Au) plating which is a material of the pad 26 in the example illustrated in FIG. 16(a). In addition, a convex-shaped electrode 62 is provided in the vicinity of the external edge part on the first layer 60 situated on the upper surface of the contact board 21.

The convex-shaped electrode 62 is made of, for example, metal having conductivity. As long as the material of the convex-shaped electrode 62 has conductivity, the material of the convex-shaped electrode 62 may be or may not be the same as that of the pad 26. In addition, the material of the convex-shaped electrode 62 may be the same material as the material of the second layer 61 illustrated in FIG. 16(b) like a material having conductivity and elasticity such as a silicon conductive rubber or a material having conductivity and high hardness such as palladium (Pd) or rhodium (Rh).

Under this structure, when the pressing plate 14 is rotated approximately 90 degrees so as to be positioned substantially in parallel with the main surface of the burn-in board 11 after the lead frame 18 (see FIG. 5) where the semiconductor packages 17 are connected is attached to the burn-in board 11, and when the latch part 29 and the block part 30 (see FIG. 5) are connected to each other and the resin parts 17a of the semiconductor packages 17 are pressed down by the pressing block 15 of the pressing plate 14, the lead parts 25 of the semiconductor packages 17 are elastically deformed and bent. The convex-shaped electrode 62 formed on the contact board 21 is forced into the lower surface of the lead part 25 due to the elastic force of the lead part 25. Furthermore, the lead parts 25 slightly move so as to partially restore their status before the elastic deformation.

As a result of this, oxide films formed on lower surfaces of the lead parts 25, part of the oxide films formed on the lead parts 25, are removed by the convex-shaped electrodes 62 formed on the contact boards 21. Because of this, it is possible to achieve electrical conductivity between the lead parts 25 of the semiconductor packages 17 and the convex-shaped electrodes 62 formed on the contact boards 21.

In the meantime, in the first modified example illustrated in FIG. 12 of the first embodiment, the concave part 30 is formed in the burn-in board 21. The area of the opening surface having the substantially rectangular-shaped configuration of the concave part 30 is slightly larger than the resin part 17a of the semiconductor package 17. However, the present invention is not limited to this structure. For example, a piercing hole may be formed in the burn-in board 11 and the resin part 17a of the semiconductor package 17 may be provided in a piercing hole via a spacer. This is discussed as a seventh modified example of the first embodiment with reference to FIG. 17.

Figure 17:
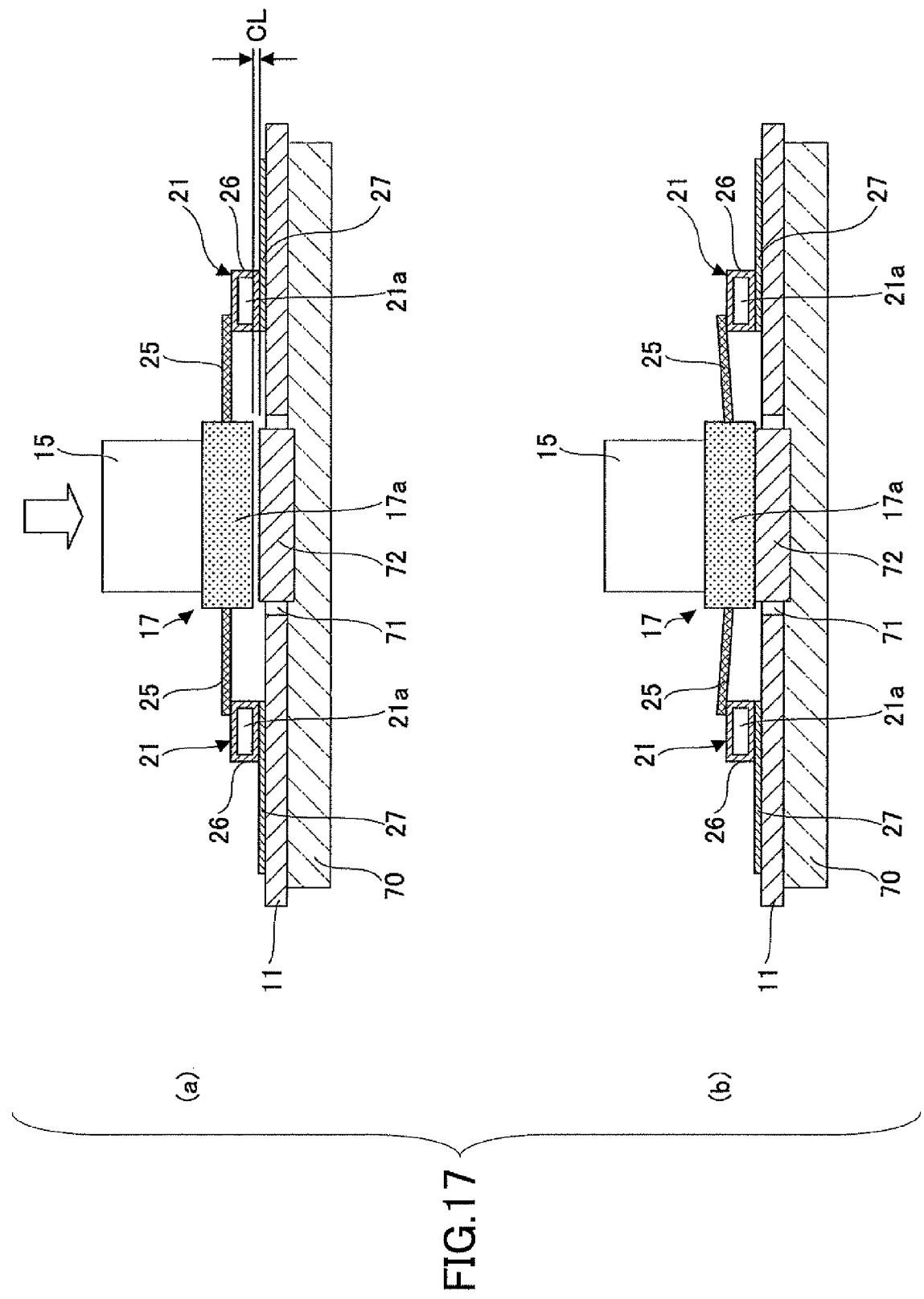
FIG. 17 is a view for explaining a seventh modified example of the first embodiment.

In the seventh modified example illustrated in FIG. 17 of the first embodiment, a piercing hole 71 is formed in the burn-in board 11 provided on a base plate 70. An area of an opening surface having a substantially rectangular-shaped configuration of the piercing hole 71 is slightly larger than the resin part 17a of the semiconductor package 17.

A spacer 72 made of antistatic resin is provided in the piercing hole 71. The height of the spacer 72 is set whereby the lead parts 25 provided on two side surfaces facing each other of the resin part 17a of the semiconductor package 17 come in contact with the upper surfaces of the contact boards 21. A clearance CL (see FIG. 17(a)) having a designated length is formed between the lower surface of the resin part 17a of the semiconductor package 17 and the upper surface of the spacer 72 when the lead frame 18 (see FIG. 5) where the semiconductor packages 17 are connected is attached to the burn-in board 11. The length of the clearance CL is set whereby the lead parts 25 are not plastically deformed even if the resin part 17a of the semiconductor package 17 is pressed down and the lower surface of the resin part 17a of the semiconductor package 17 comes in contact with the upper surface of the spacer 72 so that the lead parts 25 are deformed (bent). Although the spacer 72 is provided separately from the base plate 70 in the example illustrated in FIG. 17, the spacer 72 may be formed in a body with the base plate 70.

Under this structure, when the pressing plate 14 is rotated approximately 90 degrees so as to be positioned substantially in parallel with the main surface of the burn-in board 11 after the lead frame 18 (see FIG. 5) where the semiconductor packages 17 are connected is attached to the burn-in board 11, the pressing block 15 of the pressing plate 14 comes in contact with the upper surface of the resin part 17a of the semiconductor package 17 mounted on the contactor 13. At this time, head end parts of the lead part 25 of the semiconductor package 17 run onto the upper surfaces of the contact pads 21 as illustrated in FIG. 17(a). In addition, the clearance CL (see FIG. 17(a)) having a designated length is formed between the lower surface of the resin part 17a of the semiconductor package 17 and the upper surface of the spacer 72.

In addition, when the latch part 29 and the block part 30 (see FIG. 5) are connected to each other and the resin part 17a of the semiconductor package 17 is pressed down by the pressing block 15 of the pressing plate 14, the lower surface of the resin part 17a of the semiconductor package 17 comes in contact with the upper surface of the spacer 72. In addition, the lead part 25 of the semiconductor package 17 are elastically deformed and bent. Edge parts of the pads 26 of the contact boards 21 are forced into the lower surfaces of the lead parts 25 due to the elastic force of the lead parts 25. Furthermore, the lead parts 25 slightly move so as to partially restore their status before the elastic deformation.

As a result of this, oxide films formed on lower surfaces of the lead parts 25, parts of the oxide films formed on the lead parts 25, are removed by the edge parts of the pads 26. Because of this, it is possible to achieve electrical conductivity between the lead parts 25 of the semiconductor package 17 and the pads 26. On the other hand, the length of the clearance CL is set whereby the lead parts 25 are not plastically deformed even if the resin part 17a of the semiconductor package 17 is pressed down and the lower surface of the resin part 17a of the semiconductor package 17 comes in contact with the upper surface of the spacer 72 so that the lead parts 25 are deformed (bent). Accordingly, a pressing state where the lead parts 25 are elastically deformed is maintained. In other words, in this example, the spacer 72 functions as a stopper for preventing plastic deformation of the lead parts 25 of the semiconductor package 17.

In the above-discussed example, the piercing hole 71 is formed in the burn-in board 11 provided on the base plate 70. The spacer 72 is provided in the piercing hole 71. However, the present invention is not limited to this example. The piercing hole 71 is not always formed in the burn-in board 11. The spacer 72 may be provided on a portion of the burn-in board 11 positioned under the resin part 17a of the semiconductor package 17 when the semiconductor package 17 is mounted on the burn-in board 11.

Second Embodiment

In the above-mentioned first embodiment, the burn-in board 11 is discussed as an example of the component for the testing device. However, as illustrated in FIG. 18, plural (four in the example illustrated in FIG. 18) contactors 13 are mounted and the pressing plate 14 is provided on the main surface of a base board 80 which is a board other than the burn-in board 11.

Figure 18:
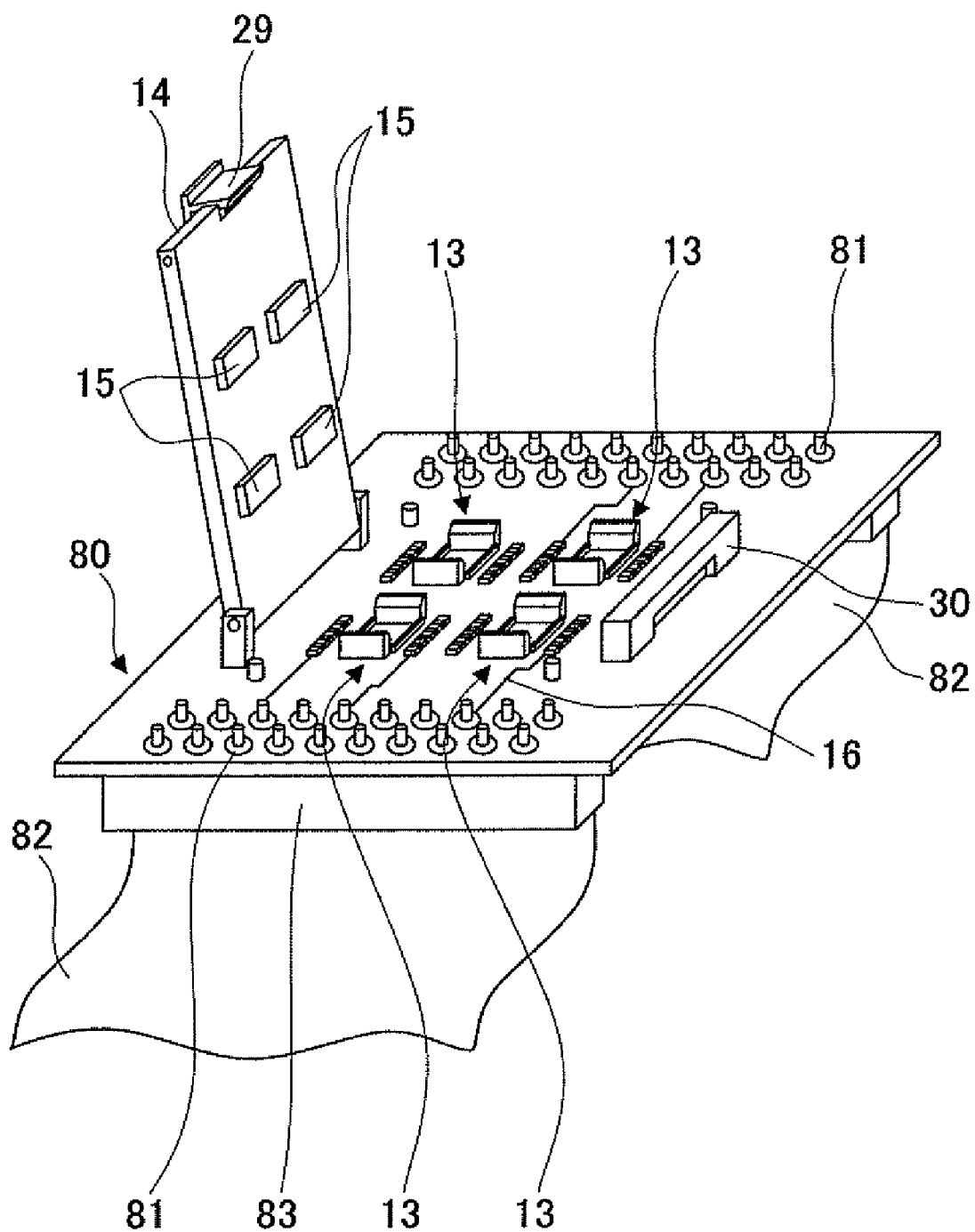
FIG. 18 is a perspective view of a base board of a second embodiment.

In the second embodiment illustrated in FIG. 18, a large number of contactors 81 are provided at end parts facing each other on a front surface of the base board 80. Terminal parts where cables 82 are connected are connected to portions corresponding to the portions where the contactors 81 are provided. The contactors 81 and the cables 82 are connected to each other via the terminal parts 83.

In addition, plural (four in the example illustrated in FIG. 18) contactors 13 are mounted and the pressing plate 14 is provided on the front surface of the base board 80.

In other words, the second embodiment of the present invention is applied to the base board 80 used for testing the reliability evaluation of the semiconductor package 17.

Thus, in the base board 80 of the second embodiment, electrical contact between the base board 80 and the semiconductor package 17 as the testing subject is achieved via the contact boards 21 mounted on the base board 80. Accordingly, it is possible to achieve the same effect as that of the first embodiment.

The structures illustrated in FIG. 12 through FIG. 17 may be formed on the base board 80 illustrated in FIG. 18.

Third Embodiment

An embodiment of the present invention can be applied to a testing board for performing a final test of the semiconductor package.

Figure 19:
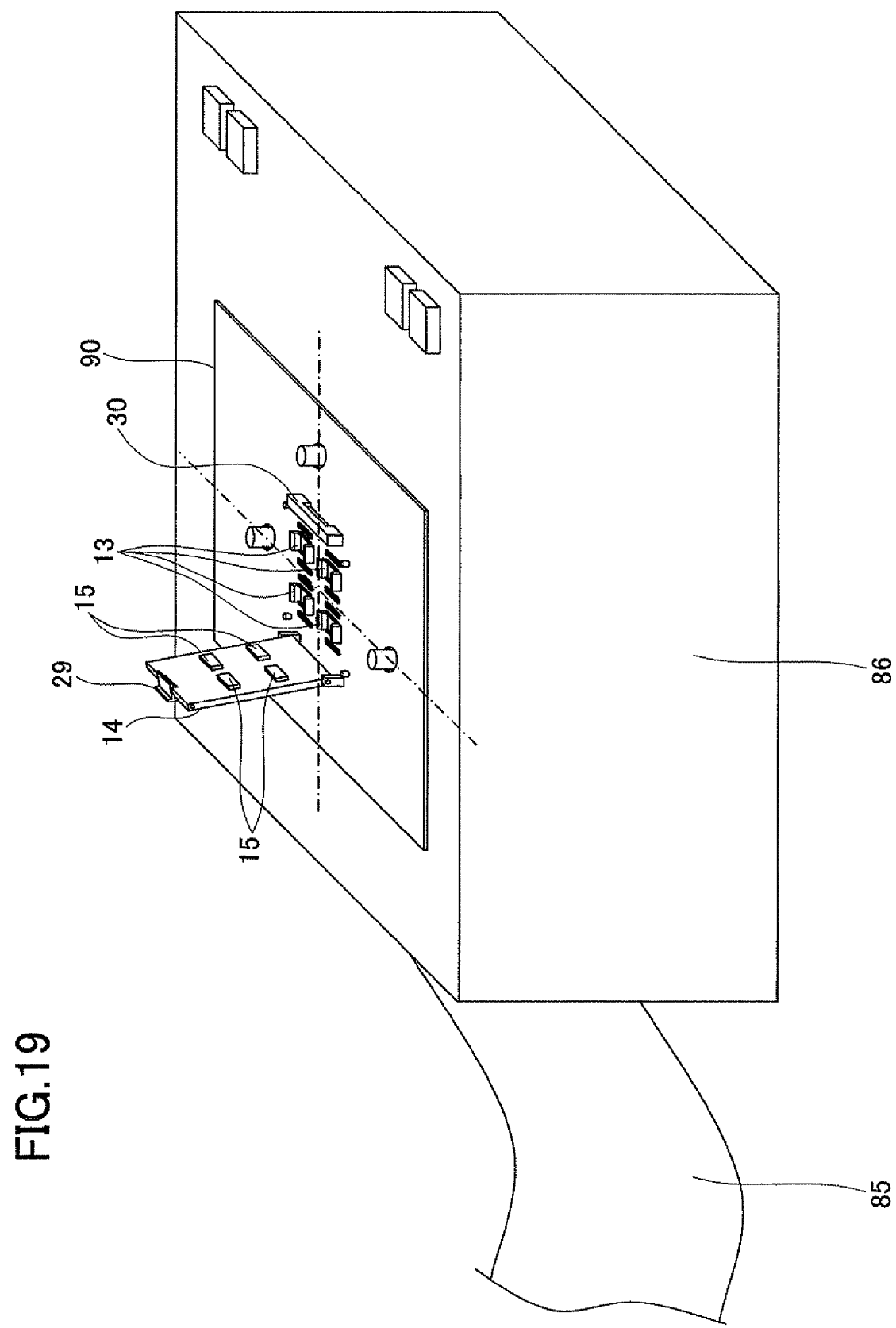
FIG. 19 is a perspective view of a test board of a third embodiment fixed to a test head.

In a third embodiment illustrated in FIG. 19 of the present invention, plural (four in the example illustrated in FIG. 18) contactors 13 are mounted and the pressing plate 14 is provided on a surface of a testing board 90 fixed on a test head 86 connected to a tester (not illustrated) via the cable 85.

In other words, the third embodiment of the present invention is applied to the testing board 90 used for performing the final test or the like of the semiconductor package 17.

The structures illustrated in FIG. 12 through FIG. 17 may be formed on the base board 80 illustrated in FIG. 18. In addition, the test of the semiconductor package 17 may be performed in only the tester (not illustrated) and the testing board 90 fixed on the test head 86 connected to the tester. Alternatively, the test of the semiconductor package 17 may be performed with combination with a handling device such as a handler.

Thus, in the third embodiment as well as the second embodiment, electrical contact between the semiconductor package 17 as the testing subject and the testing board 90 is achieved via the contact boards 21. Accordingly, it is possible to achieve the same effect as that of the first embodiment.

The structures illustrated in FIG. 12 through FIG. 17 may be formed on the base board 80 illustrated in FIG. 18.

Thus, as discussed above, according to the embodiments, it is possible to provide a component for a testing device for an electronic component and a testing method of the electronic component, whereby it is possible to increase the number of the electronic components as the testing subjects mounted on the burn-in board at low cost without an increase of the number of process steps.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A testing method of an electronic component, comprising:
    mounting a lead frame on a testing board, the lead frame being where plural electronic components are coupled;
    pressing the electronic component coupled to the lead frame and making lead parts, which are provided at two side surfaces of the electronic component, come in contact with projection electrodes formed on two contact boards facing each other and provided on the testing board in a longitudinal direction of the electronic component, so that the lead parts are elastically deformed and in contact with the projection electrodes; and
    performing an electric test of the electronic component via the projection electrodes.

2. The testing method of the electronic component as claimed in claim 1,
    wherein the lead parts come in contact with the projection electrodes in a pressing state where the lead parts are inclined against the projection electrodes.

3. The testing method of the electronic component as claimed in claim 2,
    wherein a plurality of the electronic components is coupled to the lead frame by a support bar.

4. The testing method of the electronic component as claimed in claim 1, further comprising:
    cutting an end part of the lead parts from the lead frame before the lead frame is mounted on the testing board.

5. The testing method of the electronic component as claimed in claim 1,
    wherein a main body of the electronic component is made to come in contact with a spacer provided under the main body of the electronic component when the electronic component is pressed so that deformation of the lead parts are limited to a range of elastic deformation.

6. The testing method of the electronic component as claimed in claim 1,
    wherein the mounting operation is performed in a state in which the main body of the electronic component is being positioned.

7. The testing method of the electronic component as claimed in claim 1,
    wherein the step of mounting operation is performed in a state in which the lead parts of the electronic component is being positioned.

* * * * *